(12) United States Patent
Song et al.

(10) Patent No.: US 10,727,182 B2
(45) Date of Patent: Jul. 28, 2020

(54) LAYER STRUCTURE INCLUDING DIFFUSION BARRIER LAYER AND METHOD OF MANUFACTURING THE SAME

(71) Applicant: Samsung Electronics Co., Ltd., Suwon-si, Gyeonggi-do (KR)

(72) Inventors: Hyunjae Song, Hwaseong-si (KR); Seunggeol Nam, Suwon-si (KR); Yeonchoo Cho, Seongnam-si (KR); Seongjun Park, Seoul (KR); Hyeonjin Shin, Suwon-si (KR); Jaeho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/257,189

(22) Filed: Jan. 25, 2019

(65) Prior Publication Data

US 2019/0157212 A1 May 23, 2019

Related U.S. Application Data

(62) Division of application No. 14/814,938, filed on Jul. 31, 2015, now Pat. No. 10,229,881.

(30) Foreign Application Priority Data

Feb. 16, 2015 (KR) .......................... 10-2015-0023540

(51) Int. Cl.
*H01L 23/48* (2006.01)
*H01L 23/532* (2006.01)
(Continued)

(52) U.S. Cl.
CPC .. *H01L 23/53209* (2013.01); *H01L 21/76843* (2013.01); *H01L 21/76846* (2013.01);
(Continued)

(58) Field of Classification Search
CPC .......... H01L 23/5226; H01L 23/53276; H01L 21/76743; H01L 21/76843; H01L 21/76849; H01L 21/76852
(Continued)

(56) References Cited

U.S. PATENT DOCUMENTS 8,610,278 B1 * 12/2013 Ott ...................... H01L 23/5222
257/379
8,927,415 B2 * 1/2015 Niyogi .............. H01L 21/76871
438/627

(Continued)

FOREIGN PATENT DOCUMENTS

| CN | 102593097 A | 7/2012 |
| KR | 100706805 B1 | 4/2007 |
| KR | 101335714 B1 | 12/2013 |

OTHER PUBLICATIONS

J. Hong, S. Lee, S. Lee, H. Han, C. Mahata, H. Yeon, B. Koo, S. Kim, T. Nam, B. Min, Y. Joo, Y. Kim, H. Kim and T. Lee, *Nanoscale*, 2014, DOI: 10.1039/C3NR06771H.

(Continued)

*Primary Examiner* — Nitin Parekh
(74) *Attorney, Agent, or Firm* — Harness, Dickey & Pierce, P.L.C.

(57) ABSTRACT

Example embodiments relate to a layer structure having a diffusion barrier layer, and a method of manufacturing the same. The layer structure includes first and second material layers and a diffusion barrier layer therebetween. The diffusion barrier layer includes a nanocrystalline graphene (nc-G) layer. In the layer structure, the diffusion barrier layer may further include a non-graphene metal compound layer or a graphene layer together with the nc-G layer. One of the first and second material layers is an insulating layer, a metal layer, or a semiconductor layer, and the remaining layer may be a metal layer.

14 Claims, 7 Drawing Sheets

(51) Int. Cl.
 *H01L 21/768* (2006.01)
 *H01L 23/522* (2006.01)
(52) U.S. Cl.
 CPC .. *H01L 21/76849* (2013.01); *H01L 21/76852* (2013.01); *H01L 23/5226* (2013.01)
(58) Field of Classification Search
 USPC ........................................................ 257/751
 See application file for complete search history.

(56) References Cited

U.S. PATENT DOCUMENTS

| | | | | |
|---|---|---|---|---|
| 9,087,691 | B2* | 7/2015 | Zhu | .................. B82Y 10/00 |
| 9,117,885 | B2 | 8/2015 | Saito et al. | |
| 9,159,615 | B2 | 10/2015 | Saito et al. | |
| 9,209,136 | B2 | 12/2015 | Barth | |
| 9,691,660 | B2 | 6/2017 | Shaviv | |
| 2009/0257270 | A1* | 10/2009 | Schricker | ................ H01L 45/04 |
| | | | | 365/148 |
| 2010/0181655 | A1 | 7/2010 | Colombo et al. | |
| 2010/0187693 | A1 | 7/2010 | Mountsier et al. | |
| 2011/0006425 | A1 | 1/2011 | Wada et al. | |
| 2012/0139114 | A1* | 6/2012 | Zhang | ............... H01L 21/76849 |
| | | | | 257/751 |
| 2012/0205626 | A1* | 8/2012 | Dimitrakopoulos | ........................ H01L 29/1606 |
| | | | | 257/24 |
| 2013/0069041 | A1 | 3/2013 | Zhu et al. | |
| 2013/0113102 | A1 | 5/2013 | Bao et al. | |
| 2013/0217226 | A1 | 8/2013 | Kitamura et al. | |
| 2013/0299988 | A1* | 11/2013 | Bonilla | ............. H01L 21/76877 |
| | | | | 257/751 |
| 2014/0374906 | A1 | 12/2014 | Ruhl et al. | |
| 2015/0287675 | A1* | 10/2015 | Shaviv | ................ H01L 23/5226 |
| | | | | 257/774 |

OTHER PUBLICATIONS

Notice of Allowance dated Jan. 15, 2020 in U.S. Appl. No. 16/257,171.

* cited by examiner

LAYER STRUCTURE INCLUDING DIFFUSION BARRIER LAYER AND METHOD OF MANUFACTURING THE SAME

RELATED APPLICATION

This application is a divisional of U.S. application Ser. No. 14/814,938, filed on Jul. 31, 2015, which claims priority to Korean Patent Application No. 10-2015-0023540, filed on Feb. 16, 2015, in the Korean Intellectual Property Office, the disclosure of which is incorporated herein in its entirety by reference.

BACKGROUND

1. Field

Example embodiments relate to a layer structure that is applied to an electronic device, to a layer structure having a diffusion barrier layer and/or to a method of manufacturing the same.

2. Description of the Related Art

In semiconductor apparatuses, many devices are formed on a silicon substrate, and the size of each of the devices is typically approximately a few micrometers. A plurality of metal wires are formed on the devices, and the devices may be connected via the metal wires.

As the integrity of a unit device is increased, a critical dimension (CD) of the metal wires is generally reduced. In order to solve the increase in the resistance, copper or tungsten electrode having low specific resistance are typically used. As a current repeatedly flows through the electrode, the metal (for example, the metal component) may diffuse into an insulating layer around the electrode. In order to prevent this phenomenon, a diffusion barrier is formed between the metal wire and the insulating layer.

SUMMARY

Example embodiments relate to a layer structure having a diffusion barrier layer that reduces resistance increment according to a critical dimension reduction and prevents an unnecessary material from diffusing into peripheral regions.

Example embodiments relate to a method of manufacturing the layer structure having a diffusion barrier layer.

Additional example embodiments will be set forth in part in the description which follows and, in part, will be apparent from the description, or may be learned by practice of the example embodiments.

According to an embodiment, a layer structure includes a diffusion barrier layer; a first material layer disposed on a side of the diffusion barrier layer; and a second material layer disposed on another side of the diffusion barrier layer, wherein the diffusion barrier layer includes a nanocrystalline graphene (nc-G) layer.

The diffusion barrier layer may further include a non-graphene metal compound layer. Also, the diffusion barrier layer may further include a graphene layer.

The first and second material layers may be metal layers.

One of the first and second material layers may be an insulating layer. For example, one of the first and second material layers may be a semiconductor layer, and the other of the first and second material layers may be a metal layer.

The first material layer may include a trench, and the diffusion barrier layer may cover a surface of the trench.

The first material layer, the diffusion barrier layer, and the second material layer may be sequentially stacked in the above stated order.

A conductive layer may be disposed on a portion of the first material layer, and the diffusion barrier layer may be disposed between the conductive layer and the second material layer.

The layer structure may further include a first interlayer insulating layer formed on the first material layer, a first through hole formed in the first interlayer insulating layer, a first diffusion barrier layer that fills a lower portion of the first through hole, a second diffusion barrier layer that fills an upper portion of the first through hole, and a first conductive plug material layer that fills a region between the upper portion and the lower portion of the first through hole, wherein the second material layer covers the first interlayer insulating layer, the first through hole, and the second diffusion barrier layer.

The layer structure may further include a third diffusion barrier layer between the first conductive plug material layer and the first interlayer insulating layer.

The layer structure may further include, a second interlayer insulating layer formed on the second material layer, a second through hole formed in the second interlayer insulating layer, a fourth diffusion barrier layer that fills a lower portion of the second through hole, a fifth diffusion barrier layer that fills an upper portion of the second through hole, a second conductive plug material layer that fills a region between the lower portion and the upper portion of the second through hole, and an upper layer that covers the second interlayer insulating layer and the fifth diffusion barrier layer.

The fifth diffusion barrier layer may extend between the second interlayer insulating layer and the upper layer.

According to an example embodiment, a method of manufacturing a layer structure includes, forming a diffusion barrier layer on a first material layer, and forming a second material layer on the diffusion barrier layer, wherein the diffusion barrier layer comprises an nc-G layer.

The method may further include forming a non-graphene metal compound layer between the first material layer and the diffusion barrier layer.

The method may further include forming a graphene layer between the diffusion barrier layer and the second material layer.

The first and second material layers may be metal layers.

One of the first and second material layers may be an insulating layer.

One of the first and second material layers may include a p-type dopant or an n-type dopant.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Figure 1:
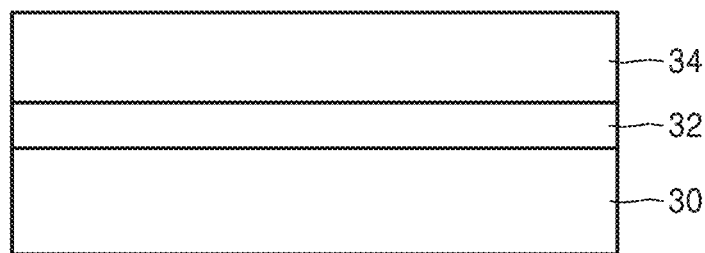
FIGS. 1 through 8 are cross-sectional views illustrating a layer structure having a diffusion barrier layer according to an example embodiment.

Reference will now be made in detail to example embodiments illustrated in the accompanying drawings. In the drawings, the thicknesses of layers and regions are exaggerated for clarity.

First, a layer structure having a diffusion barrier layer according to an example embodiment will be described.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

FIG. 1 is a cross-sectional view of a layer structure having a diffusion barrier layer according to an example embodiment.

Referring to FIG. 1, the layer structure includes a first material layer 30, a diffusion barrier layer 32, and a second material layer 34 that are sequentially stacked. The first material layer 30 may be, for example, a metal layer, an insulating layer, or a semiconductor layer. The semiconductor layer may be a semiconductor layer doped with conductive impurities. The conductive impurities may be, for example, a p-type dopant or an n-type dopant. The dopant may be, for example, P, As, or B, and may be any dopant well known in the semiconductor process. The diffusion barrier layer 32 may be a nanocrystalline graphene (nc-G) layer. The diffusion barrier layer 32 may further include other material layers besides the nc-G layer. For example, the other material layers may be configured to have diffusion barrier function. The example where the diffusion barrier layer 32 further includes other material layers will be described below.

In the nc-G layer, the size of the nanocrystalline may be, for example, less than 100 nm. The nc-G layer is mostly formed of carbon and may include a small amount of oxygen. The nc-G layer may have a thickness, for example, in a range from about 1 nm to about 10 nm. Although it will be described below, the nc-G layer may have a ratio (D/G) of D-band to G-band that is greater than 1. Also, the nc-G layer may have a ratio (2D/G) of 2D-band to G-band that is less than 1.

The second material layer 34 may be, for example, a metal layer. Here, the metal layer may include a metal that is used as a wire. The metal that is used as a wire may include, for example, Al, W, Cu, or Si.

In FIG. 1, the location of the first material layer 30 may be substituted with the second material layer 34.

Figure 2:
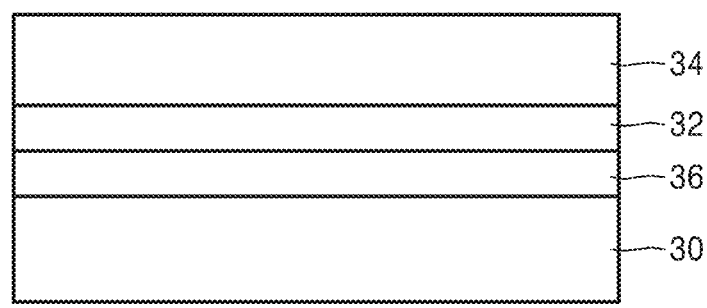

FIG. 2 is a cross-sectional view of a layer structure having a diffusion barrier layer according to another example embodiment. Like reference numerals are used to indicate elements that are substantially identical to the elements of FIG. 1, which will be applied to other example embodiments described below.

Referring to FIG. 2, a non-graphene metal compound layer 36 is disposed on the first material layer 30. The diffusion barrier layer 32 is disposed on the non-graphene metal compound layer 36. The non-graphene metal compound layer 36 denotes a metal compound layer that does not include a graphene component. The non-graphene metal compound layer 36 has a diffusion barrier function. The non-graphene metal compound layer 36 may be, for example, TiSiN, but is not limited thereto.

In various example embodiments, the non-graphene metal compound layer 36 may also be located between the diffusion barrier layer 32 and the second material layer 34.

Figure 3:
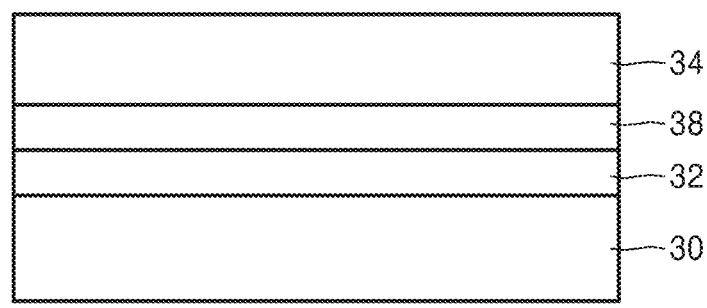

FIG. 3 is a cross-sectional view of a layer structure having a diffusion barrier layer according to another example embodiment.

Referring to FIG. 3, a graphene layer 38 is formed on the diffusion barrier layer 32. The second material layer 34 is disposed on the graphene layer 38.

In FIGS. 2 and 3, the non-graphene metal compound layer 36 (FIG. 2) or the graphene layer 38 (FIG. 3) may be included in the layer structure together with the diffusion barrier layer 32 that includes an nc-G layer, and thus, the function of preventing the diffusion of unnecessary material from the first material layer 30 to the second material layer 34, or from the second material layer 34 to the first material layer 30, may be increased. For example, the unnecessary material may be a material that reduces intrinsic characteristics of the first material layer 30 and/or the second material layer 34 by diffusing outside the first material layer 30 and the second material layer 34 during thermal processing of the layer structure or during, before or after operation of a device that includes the layer structure. For example, if the first material layer 30 and the second material layer 34 are electrodes, the unnecessary material may be a metal component (for example, Cu or Al) included in the electrode layers.

In FIGS. 1 through 3, the diffusion barrier layer 32 may be disposed on lower and side surfaces of the first material layer 30, and may be disposed on a side surface and an upper surface of the second material layer 34. In this case also, the non-graphene metal compound layer 36 or the graphene layer 38 may be included together with the diffusion barrier layer 32.

Figure 4:
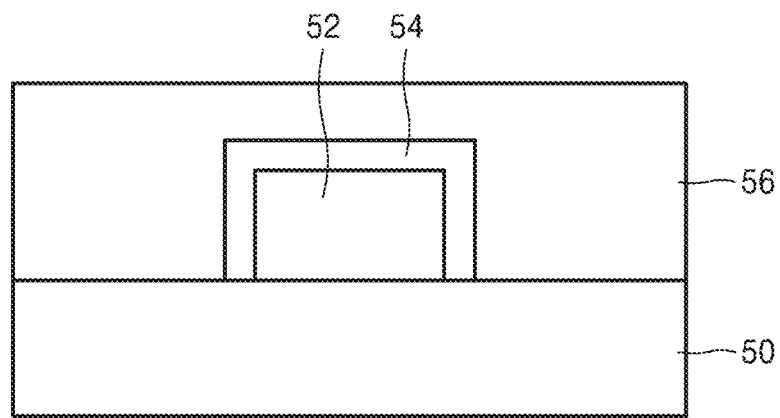
Figure 5:
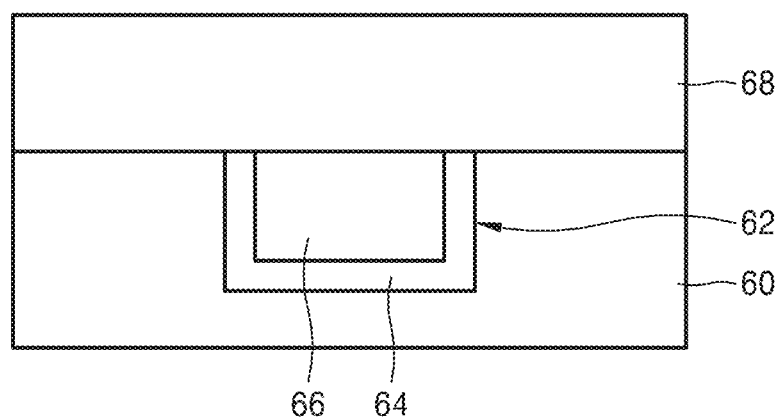
Figure 6:
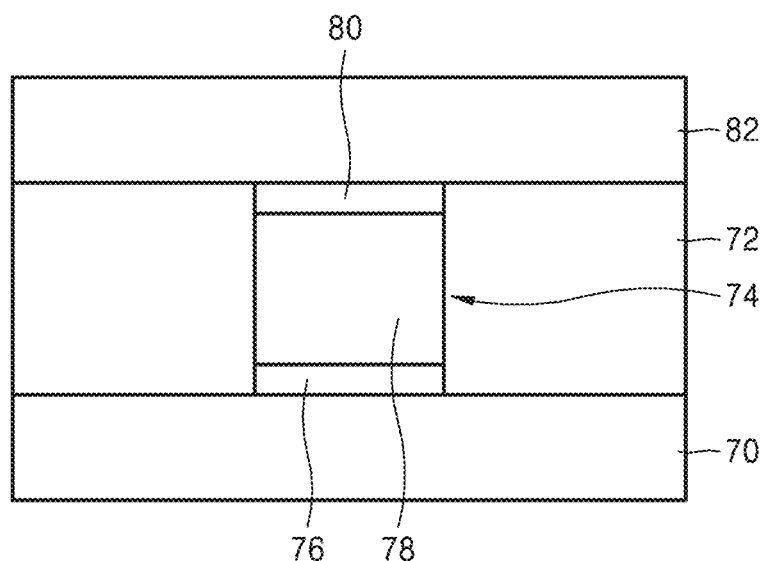

FIGS. 4 through 6 further show modified versions of the layer structure having a diffusion barrier layer.

Referring to FIG. 4, a conductive layer 52 is formed on a region of a lower layer 50. The lower layer 50 may be a material layer having conductivity, insulating property, or semiconductor characteristics. The conductive layer 52 may be a line pattern, such as a metal wiring. The conductive layer 52 may be substantially equivalent to, similar to or the same as the first material layer 30 described with reference of FIGS. 1 through 3. A surface of the conductive layer 52 is covered by a diffusion barrier layer 54. The diffusion barrier layer 54 may directly contact the conductive layer 52. The diffusion barrier layer 54 may be substantially the same material layer included between the first material layer 30 and the second material layer 34 described with reference to FIGS. 1 through 3. An upper layer 56 that covers the diffusion barrier layer 54 may be formed on the lower layer 50. The upper layer 56 covers the diffusion barrier layer 54 and may cover substantially the whole upper surface of the lower layer 50 around the diffusion barrier layer 54. The whole upper surface of the upper layer 56 may be substantially even. The upper surface of the upper layer 56 may be higher than the diffusion barrier layer 54. The upper layer 56 may be substantially equivalent to, similar to or the same as the second material layer 34 of FIGS. 1 through 3. The upper layer 56 may be an insulating layer.

FIG. 5 is a cross-sectional view of a lower layer 60 that includes a metal wiring and a diffusion barrier layer 64.

Referring to FIG. 5, a trench 62 is formed in the lower layer 60. The lower layer 60 may be substantially equivalent to, similar to or the same as the first material layer 30 or the second material layer 34 of FIGS. 1 through 3. Surfaces of the trench 62 (for example, a bottom and side surfaces) are covered by the diffusion barrier layer 64. The diffusion barrier layer 64 may be substantially equivalent to, similar to or the same as diffusion barrier layer 54 of FIG. 4. The trench 62 is filled with a buried material layer 66. The buried material layer 66 may be substantially equivalent to, similar to or the same as the second material layer 34 or the first material layer 30 of FIGS. 1 through 3. An upper layer 68 that covers the diffusion barrier layer 64 and the buried material layer 66 is disposed on the lower layer 60. The upper layer 68 may cover substantially the whole upper surface of the lower layer 60 around the trench 62. The upper layer 68 may be an insulating layer. The upper layer 68 may be substantially the same material as the buried material layer 66. In this case, the diffusion barrier layer 64 may cover substantially the whole upper surface of the lower layer 60 by extending between the lower layer 60 and the upper layer 68 around the trench 62.

FIG. 6 is a cross-sectional view of a layer structure having diffusion barrier layers respectively formed on an upper portion and a lower portion of a through hole.

Referring to FIG. 6, a first interlayer insulating layer 72 is formed on a lower layer 70. A first through hole 74 is formed through which an upper surface of the lower layer 70 is exposed in the first interlayer insulating layer 72. The lower layer 70 may be the same material layer as the first material layer 30 of FIG. 1. A first diffusion barrier layer 76 is formed on the upper surface of the lower layer 70 that is exposed through the first through hole 74. Substantially the whole exposed upper surface of the lower layer 70 is covered by the first diffusion barrier layer 76. As a result, a lower portion of the first through hole 74 is filled with the first diffusion barrier layer 76. The first diffusion barrier layer 76 may be substantially the same material layer as the diffusion barrier layer 54 of FIG. 4. Most of the first through hole 74 on the first diffusion barrier layer 76 is filled with a first conductive plug material layer 78. The first conductive plug material layer 78 fills most of the first through hole 74 besides the upper portion and the lower portion of the first through hole 74. A second diffusion barrier layer 80 that fills the upper portion of the first through hole 74 is formed on the first conductive plug material layer 78. The second diffusion barrier layer 80 may be substantially the same material layer as the diffusion barrier layer 54 of FIG. 4. The first and second diffusion barrier layers 76 and 80 may be substantially the same material layers, but may have different configurations from each other. For example, the first diffusion barrier layer 76 may include the diffusion barrier layer 32 of FIG. 1, the second diffusion barrier layer 80 may include the non-graphene metal compound layer 36 and the diffusion barrier layer 32 of FIG. 2 or the diffusion barrier layer 32 and the graphene layer 38 of FIG. 3. A height of an upper surface of the second diffusion barrier layer 80 may be substantially the same as the height of an upper surface of the first interlayer insulating layer 72. The first conductive plug material layer 78 may be a path that physically and electrically connects the lower layer 70 and the upper layer 82 together with the first and second diffusion barrier layers 76 and 80. The first conductive plug material layer 78 may be substantially the same material layer as the second material layer 34 of FIG. 1. Also, the first conductive plug material layer 78 may be a metal compound layer or a material layer that includes a dopant.

In at least one embodiment, an upper layer 82 that covers the second diffusion barrier layer 80 is formed on the first interlayer insulating layer 72. The upper layer 82 may contact the whole upper surface of the second diffusion barrier layer 80 and may cover the whole upper surface of the first interlayer insulating layer 72 around the first through hole 74. The upper layer 82 may be substantially the same material layer as the first material layer 30 of FIG. 1. However, the lower layer 70 and the upper layer 82 may be different material layers from each other.

In at least one example embodiment, the first diffusion barrier layer 76 that includes nc-G is disposed between the lower layer 70 and the first conductive plug material layer 78, and the second diffusion barrier layer 80 that includes nc-G is disposed between the upper layer 82 and the first conductive plug material layer 78. Therefore, the diffusion of unnecessary material between the lower layer 70 and the first conductive plug material layer 78 and between the upper layer 82 and the first conductive plug material layer 78 may be reduced compared to a conventional case in which a non-graphene barrier layer is used.

In FIG. 6, one of the first and second diffusion barrier layers 76 and 80 may be included. For example, only the first diffusion barrier layer 76 may be formed. In this case, the first conductive plug material layer 78 and the upper layer 82 may be substantially the same material layers.

Figure 7:
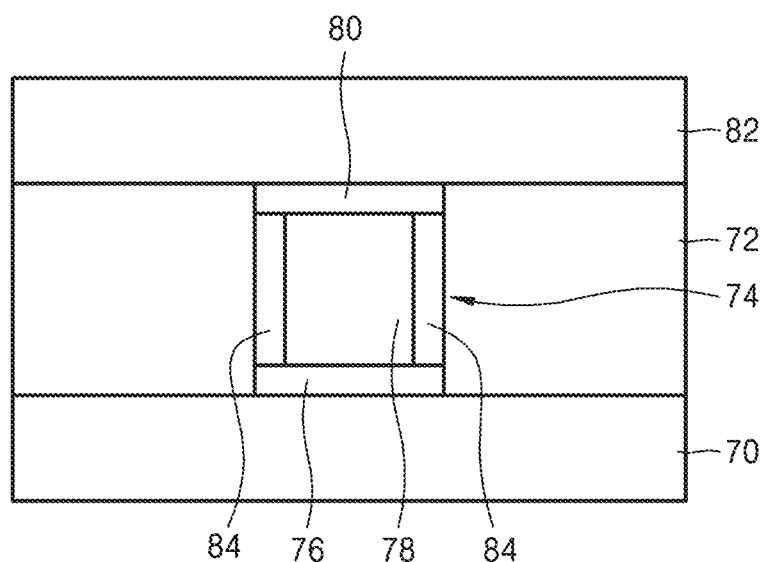

Also, as depicted in FIG. 7, a third diffusion barrier layer 84 may further be disposed between the first conductive plug material layer 78 and the first interlayer insulating layer 72. The third diffusion barrier layer 84 may be a diffusion barrier layer that includes nc-G described above. If lateral diffusion is not large in the first conductive plug material layer 78, the third diffusion barrier layer 84 may be a diffusion barrier layer that does not include the nc-G. The third diffusion barrier layer may be formed to cover inner sides of the first through hole 74. After the third diffusion barrier layer 84 is formed, the first diffusion barrier layer 76 may be formed. Alternatively, after the first diffusion barrier layer 76 is formed, the third diffusion barrier layer 84 may be formed.

A layer structure of the third diffusion barrier layer 84 may be substantially the same as the layer structures of the first and second diffusion barrier layers 76 and 80. In the example of FIG. 7, only one of the first and second diffusion barrier layers 76 and 80 may be formed.

Figure 8:
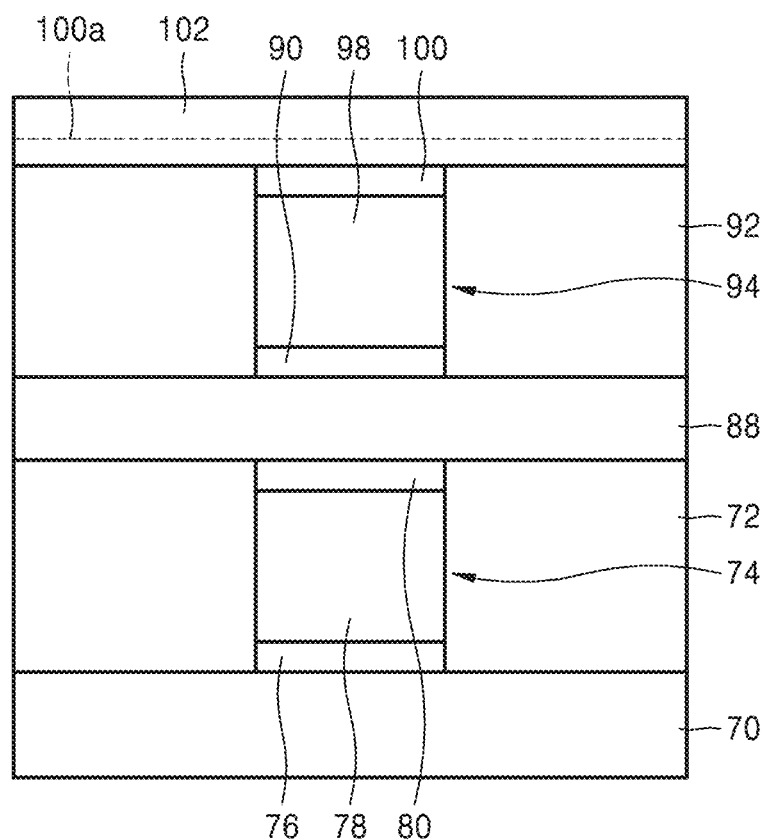

The layer structure described above may be formed as a stack type. For example, in FIG. 6, a layer structure that includes a diffusion barrier layer described above may further be disposed on the upper layer 82. FIG. 8 shows an example of this case. Like reference numerals are used to indicate elements that are substantially the same as the elements described above.

Referring to FIG. 8, a second interlayer insulating layer 92 is formed on an intermediate layer 88. The intermediate layer 88 may be substantially equivalent to, similar to or the same as the upper layer 82 of FIG. 6. The second interlayer insulating layer 92 may be formed of substantially the same material used to form the first interlayer insulating layer 72, or may be formed of a different material. A second through hole 94 is formed in the second interlayer insulating layer 92. A portion of an upper surface of the intermediate layer 88 is exposed through the second through hole 94. The second through hole 94 may be located directly above the first through hole 74 or may be disposed on a left side or a right side of the first through hole 74 in a horizontal direction. The upper surface of the intermediate layer 88 that is exposed through the second through hole 94 is covered by a fourth diffusion barrier layer 90. That is, a lower portion of the second through hole 94 is filled with the fourth diffusion barrier layer 90. The fourth diffusion barrier layer 90 may directly contact substantially the entire exposed surface of the intermediate layer 88. A portion of the second through hole 94 above the fourth diffusion barrier layer 90 is filled with a second conductive plug material layer 98. For example, the second conductive plug material layer 98 may fill most of an upper part of the second through hole 94, but may not fill an upper edge portion of the second through hole 94. The upper edge of the second through hole 94 is filled with a fifth diffusion barrier layer 100. In this manner, the second through hole 94 may be filled by sequentially stacking the fourth diffusion barrier layer 90, the second conductive plug material layer 98, and the fifth diffusion barrier layer 100. The fourth and fifth diffusion barrier layers 90 and 100 may be diffusion barrier layers that include nc-G as described above. An upper layer 102 that covers the fifth diffusion barrier layer 100 is formed on the second interlayer insulating layer 92. The upper layer 102 may be or may not be substantially the same material layer as the upper layer 82 of FIG. 6.

Alternatively, in the second through hole 94, a region of the second through hole 94 above the fourth diffusion barrier layer 90 may be completely filled with the second conductive plug material layer 98. At this point, the fifth diffusion barrier layer 100, as depicted in a dotted box 102*a*, may be formed to cover the second interlayer insulating layer 92 and the second conductive plug material layer 98. That is, the fifth diffusion barrier layer 100 may be disposed between the second interlayer insulating layer 92 and the second conductive plug material layer 98 and the upper layer 102.

In the case of FIG. 8, a diffusion barrier layer that is substantially the same as the third diffusion barrier layer 84 of FIG. 7 may be disposed.

Measurement results of characteristics of a layer structure having a diffusion barrier layer according to an example embodiment will be described with reference to FIGS. 9 through 12.

Figure 9:
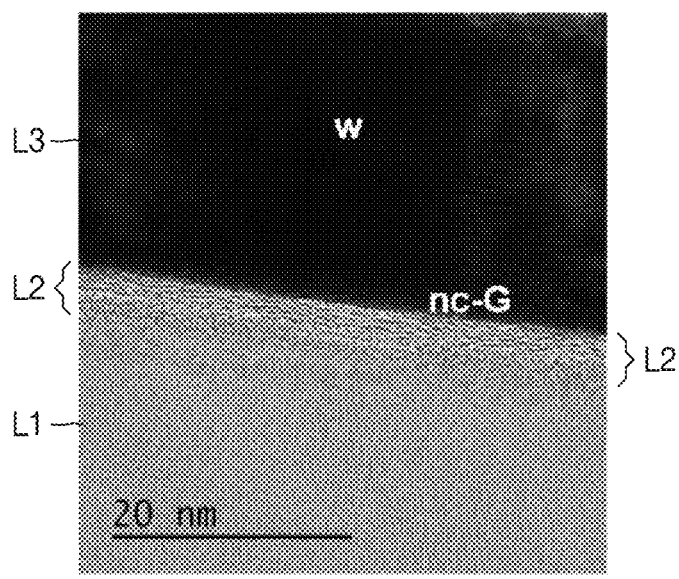
FIG. 9 is a transmission electron microscope (TEM) image of a diffusion barrier layer in a layer structure having the diffusion barrier layer according to an example embodiment.

FIG. 9 is a transmission electron microscope (TEM) image of a layer structure having the diffusion barrier layer (for example, the layer structure of FIG. 1) according to an example embodiment.

In FIG. 9, reference numeral L1 indicates a lower layer (a poly silicon layer), L2 indicates a diffusion barrier layer (an nc-G layer), and L3 indicates an upper layer (a tungsten layer). In the diffusion barrier layer L2, the size of the nanocrystalline is smaller than 100 nm.

Figure 10:
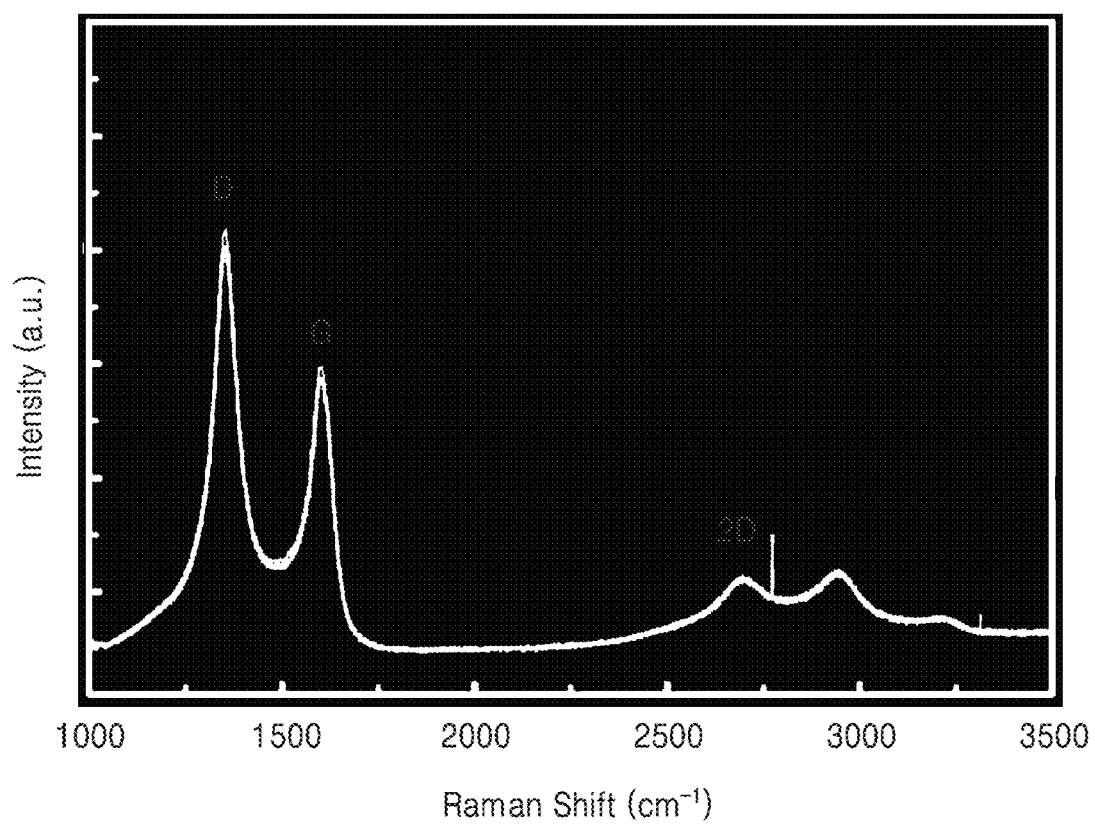
FIG. 10 is a graph showing the result of Raman spectroscopic analysis with respect to a diffusion barrier layer according to an example embodiment.

FIG. 10 is a graph showing the result of Raman spectroscopic analysis with respect to the diffusion barrier layer L2 of the layer structure that is used for obtaining the results of FIG. 9. In FIG. 10, an X-axis indicates Raman shift ($cm^{-1}$) and a Y-axis indicates intensity.

Referring to FIG. 10, a ratio (D/G) of D band to G band is greater than 1. Also, a ratio (2D/G) of 2D band to G band is smaller than 1. This result indicates that the diffusion barrier layer L2 is an nc-G layer.

Figure 11:
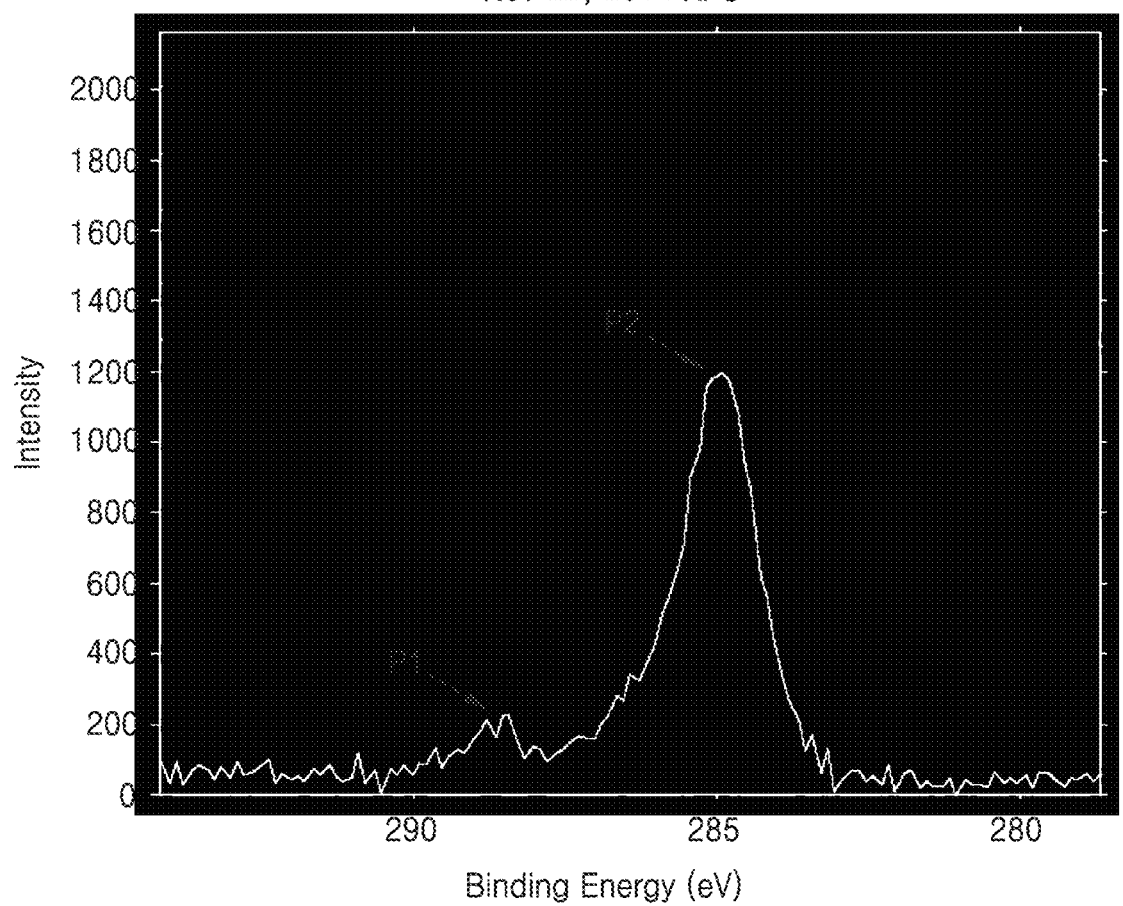
FIG. 11 is a graph showing the result of x-ray photoelectron spectroscopy (XPS) with respect to a diffusion barrier layer in a layer structure having the diffusion barrier layer according to an example embodiment.

FIG. 11 is a graph illustrating the result of x-ray photoelectron spectroscopy (XPS) with respect to the diffusion barrier layer L2 of the layer structure used to obtain the results of FIG. 9. In FIG. 11, the X-axis indicates binding energy (eV) and the Y-axis indicates intensity. A first peak P1 indicates the intensity of carbon-oxygen binding (C=O) and a second peak P2 indicates the intensity of carbon-carbon binding (C=C).

In FIG. 11, when the first and second peaks P1 and P2 are compared, the intensity of carbon-oxygen binding is approximately 10% of the intensity of carbon-carbon binding.

This result of FIG. 11 indicates that the diffusion barrier layer L2 is mostly carbon, but includes a certain amount of oxygen. That is, the result of FIG. 11 indicates that the diffusion barrier layer L2 is an nc-G layer.

Figure 12:
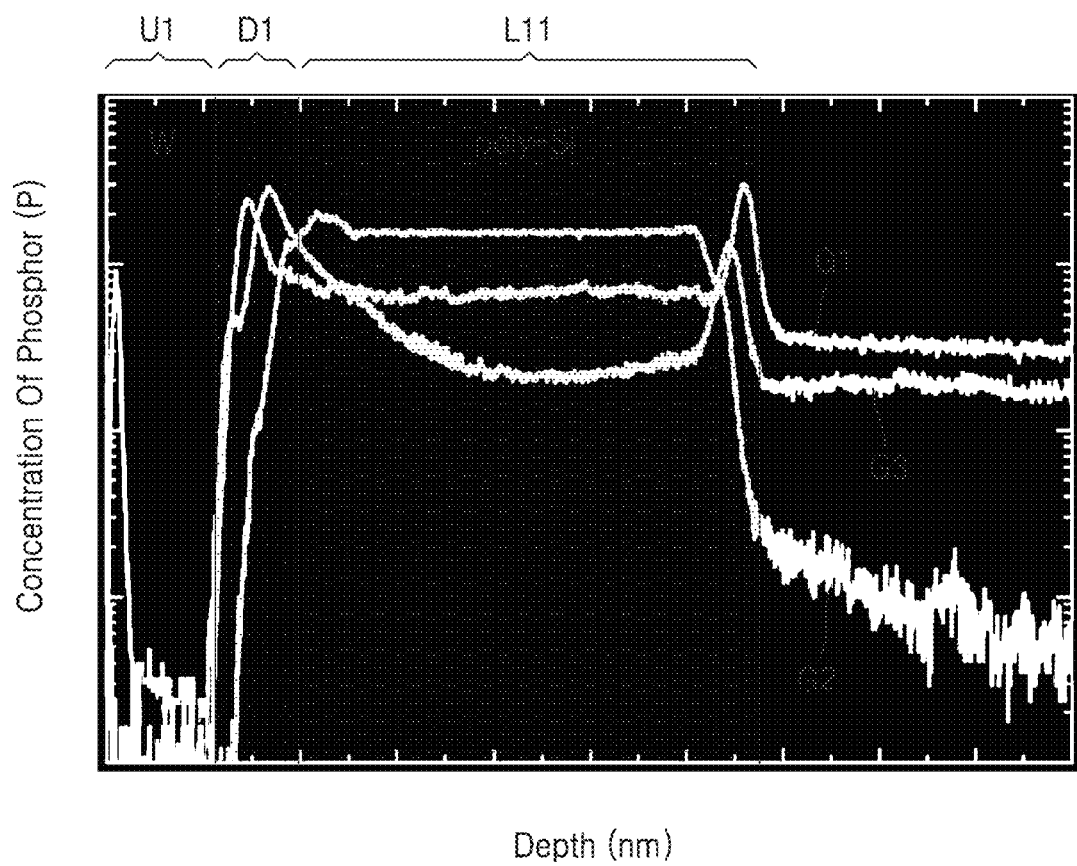
FIG. 12 is a graph showing the result of secondary ion mass spectroscopy (SIMS) with respect to a diffusion barrier layer when the diffusion barrier layer includes a nanocrystalline graphene in a layer structure having the diffusion barrier layer according to an example embodiment.

FIG. 12 is a graph showing the result of secondary ion mass spectroscopy (SIMS) with respect to a layer structure according to an example embodiment. In FIG. 12, the X-axis indicates a depth nm measured from an upper surface of an uppermost layer of the layer structure and the Y-axis indicates concentration of phosphor (P).

The layer structure (a first layer structure) used to obtain the result of FIG. 12 is upper layer (a W layer)/diffusion barrier layer (an nc-G layer/TSN layer)/lower layer (polysilicon layer). The TSN layer may be included in the lower layer. The first layer structure is thermally treated after formation. Here, the upper layer (W layer) has a thickness of approximately 20 nm. As a comparison group for comparing the result of the first layer structure, second and third layer structures are used. The second and third layer structures are conventional layer structures that include non-graphene diffusion barrier layers. The second layer structure has a layer configuration of an upper layer (W layer/WSi layer)/diffusion barrier layer (TSN layer)/lower layer (polysilicon layer), and the second layer structure is not thermally treated after formation. That is, the second layer structure is a standard layer structure that is maintained so the diffusion phenomenon does not take place after formation. The layer configuration of the third layer structure is the same as the layer configuration of the second layer structure, but the third layer structure is thermally treated after formation.

In FIG. 12, a first graph G1 shows a result with respect to the first layer structure, and a second graph G2 shows a result with respect to the second layer structure, and a third graph G3 shows a result with respect to the third layer structure. In FIG. 12, reference numeral U1 indicates an upper layer, reference numeral D1 indicates a diffusion barrier layer, and reference numeral L11 indicates a lower layer.

In FIG. 12, when the first through third graphs G1 through G3 are compared, the concentration of phosphor in the lower layer (polysilicon layer) L11 is reduced in the order of the second graph G2, the first graph G1, and the third graph G3. In the lower layer L11, the concentration of phosphor in the first and third layers G1 and G3 is lower than the reference graph G2. This is a result of diffusing phosphor of the lower layer L11 to the outside in a process of thermally treating the first and third layer structures. The second graph G2 is a result with respect to a reference layer structure, and thus, if the second graph G2 is excluded from the comparison, the results of the first and third graphs G1 and G3 are resulted from the difference of the diffusion barrier layers of the first and third layer structures.

As a result, the result of FIG. 12 shows that the diffusion barrier function of the diffusion barrier layer (an nc-G layer) included in the first layer structure is superior to the diffusion barrier function of the diffusion barrier layer (a non-graphene diffusion barrier layer) included in the third layer structure.

According to at least one example embodiment, a method of manufacturing a layer structure having a diffusion barrier layer will be described with reference to FIGS. 13 and 14. Like reference numerals are used to indicate substantially identical elements described above.

Figure 13:
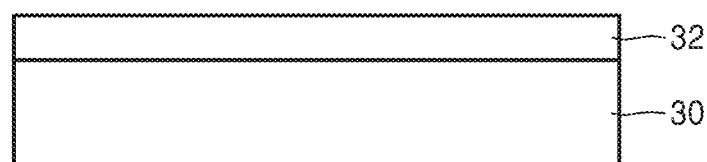
FIGS. 13 and 14 are cross-sectional views illustrating a method of manufacturing a layer structure having a diffusion barrier layer according to an example embodiment.

Referring to FIG. 13, a diffusion barrier layer 32 is formed on a first material layer 30. The diffusion barrier layer 32 may be formed with a layer including at least an nc-G layer. At this point, the nc-G layer may be formed at a temperature, for example, in a range from about 400° C. to about 750° C. without using an additional catalyst. The diffusion barrier layer 32 is formed to a thickness, for example, in a range of about 1 nm to about 10 nm. The size of nanocrystalline of the diffusion barrier layer 32 may be formed smaller than 100 nm by controlling a process condition, for example, controlling a temperature.

A metal compound layer 36 as depicted in FIG. 2 may further be formed between the diffusion barrier layer 32 and the first material layer 30. Also, as depicted in FIG. 3, a graphene layer 38 may further formed on the diffusion barrier layer 32.

Figure 14:
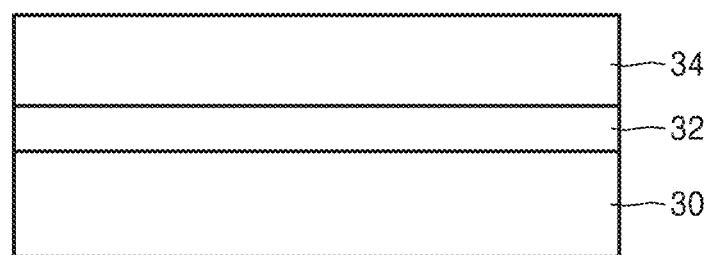

Next, referring to FIG. 14, a second material layer 34 is formed on the diffusion barrier layer 32. The first and second material layers 30 and 34 may be formed by using a well known method of forming a metal layer, an insulating layer, or a semiconductor layer.

The layer structures depicted in FIGS. 4 through 6 may also be readily manufactured by using the method described with reference to FIGS. 13 and 14.

In a layer structure having a diffusion barrier layer, a nanocrystalline graphene layer is used as the diffusion barrier layer. Accordingly, the thickness of the diffusion barrier layer may be reduced compared to the thickness of a conventional diffusion barrier layer. Also, the amount of unnecessary material (for example, a metal component) diffusing outside crossing over the diffusion barrier layer may be reduced compared to a conventional diffusion barrier layer, that is, a non-graphene metal diffusion barrier layer. Thus, intrinsic functions and characteristics of material layers that are separated by the diffusion barrier layer may further be maintained. Accordingly, when the layer structure according to an example embodiment is applied to electronic devices, for example, memory devices or logic devices, the reduction of characteristics of the corresponding electronic devices may be reduced or substantially prevented.

While one or more example embodiments have been described with reference to the figures, it will be understood by those of ordinary skill in the art that various changes in form and details may be made therein without departing from the spirit and scope as defined by the following claims.

What is claimed is:

1. A layer structure comprising:
a diffusion barrier layer;
a first material layer on a side of the diffusion barrier layer; and
a second material layer on another side of the diffusion barrier layer,
wherein the diffusion barrier layer includes a nanocrystalline graphene (nc-G) layer having a size less than 100 nm,
wherein the nc-G layer has a ratio (2D/G) of 2D-band to G-band that is less than 1, and
wherein the second material layer is surrounded by the first material layer and the diffusion barrier layer.

2. The layer structure of claim 1, wherein the diffusion barrier layer further comprises a non-graphene metal compound layer.

3. The layer structure of claim 1, wherein the diffusion barrier layer further comprises a graphene layer.

4. The layer structure of claim 1, wherein the first material layer and the second material layer are metal layers.

5. The layer structure of claim 1, wherein a first one of the first material layer and the second material layer is an insulating layer.

6. The layer structure of claim 5, wherein a second one of the first material layer and the second material layer is a metal layer.

7. The layer structure of claim 1, wherein a first one of the first material layer and the second material layer is a semiconductor layer.

8. The layer structure of claim 7, wherein a second one of the first material layer and the second material layer is a metal layer.

9. The layer structure of claim 7, wherein the semiconductor layer comprises a p-type dopant or an n-type dopant.

10. The layer structure of claim 1, wherein the first material layer comprises a trench, and the diffusion barrier layer covers a surface of the trench.

11. The layer structure of claim 10, wherein the trench is filled with the diffusion barrier layer and the second material layer, and height of an upper surface of the first material layer is the same as that of the second material layer.

12. The layer structure of claim 10, wherein the first material layer, the second material layer, the trench and the diffusion barrier layer are covered with the same insulating layer.

13. The layer structure of claim 1, wherein the first material layer, the diffusion barrier layer, and the second material layer are sequentially stacked.

14. A layer structure comprising:
a diffusion barrier layer;
a first material layer on a side of the diffusion barrier layer; and
a second material layer on another side of the diffusion barrier layer,
wherein the diffusion barrier layer includes a nanocrystalline graphene (nc-G) layer having a size less than 100 nm, and
wherein the nc-G layer has a ratio (2D/G) of 2D-band to G-band that is less than 1,
wherein a conductive layer is on a portion of the first material layer, and the diffusion barrier layer is between the conductive layer and the second material layer,
wherein the conductive layer is surrounded by the diffusion barrier layer and the second material layer, and the conductive layer, the diffusion barrier layer and the second material layer form a surface that is in contact with an upper surface of the first material layer.

* * * * *